(12) United States Patent
Takeda et al.

(10) Patent No.: US 6,293,006 B1
(45) Date of Patent: Sep. 25, 2001

(54) ELECTRONIC COMPONENT MOUNTING METHOD

(75) Inventors: Takeshi Takeda, Nakakoma-gun; Osamu Nakao; Akira Shiomi, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/332,675

(22) Filed: Jun. 14, 1999

(30) Foreign Application Priority Data

Jun. 15, 1998 (JP) .................................................. 10-166683

(51) Int. Cl.[7] ...................................................... H05K 3/30
(52) U.S. Cl. .................................. 29/832; 29/739; 29/740; 29/707; 29/DIG. 44; 318/135; 310/12; 901/40; 294/64.1; 414/737; 414/751.1; 414/752.1
(58) Field of Search .......................... 29/740, 743, 602.1, 29/706, 596, 707, 714, DIG. 44, 832, 840, 709; 318/135; 310/12, 14; 901/40; 294/64.1; 414/737, 751.1, 752.1

(56) References Cited

U.S. PATENT DOCUMENTS

| 4,705,311 | 11/1987 | Ragard . | |
|---|---|---|---|
| 5,726,508 | * 3/1998 | Neff et al. | 29/740 |
| 5,758,410 | * 6/1998 | Asai et al. | 29/740 |
| 5,765,277 | * 6/1998 | Jin et al. | 29/740 |
| 5,783,915 | * 7/1998 | Shida et al. | 318/135 |

FOREIGN PATENT DOCUMENTS

| 08203966 | * 8/1996 | (JP) . |
| 11121989 | * 4/1999 | (JP) . |

* cited by examiner

*Primary Examiner*—Lee Young
*Assistant Examiner*—Rick Kiltae Chang
(74) *Attorney, Agent, or Firm*—Jordan and Hamburg LLP

(57) ABSTRACT

A method of controlling a mounting unit having a shaft operated under servo control using a current driven actuator, comprises the steps of detecting interrruption of the servo control, and switching from a positioning control mode to a constant current control mode for supplying an constant amount of current to the shaft actuator to suspend the shaft. In an embodiment the method further includes engaging a gripping device, for holding the shaft, so as to keep the shaft from free-falling when interruption of the servo control is detected, and maintaining the constant current control mode at least until the gripping device grips the shaft. Still further, the current control mode optionally includes the steps of maintaining the supply of the constant amount of current for a predetermined period of time, and disengaging power supplied to the actuator after the predetermined period of time has elapsed.

12 Claims, 6 Drawing Sheets

ELECTRONIC COMPONENT MOUNTING METHOD

BACKGROUND

The present invention relates to an electronic component mounting method implemented in an automatic electronic component mounting apparatus.

Electronic component mounting apparatuses have been desired to be operated at a high speed and with high accuracy in recent years. A multi-functional component mounter equipped with a component transfer head movable in X and Y directions by means of an X-Y robot for picking up and mounting electronic components has been accordingly widespread in the market because of the flexibility of component supply modes, the abundance of component types that can be mounted, and high mounting precision due to simplicity of its construction.

At the moment, in an attempt to further accelerate the operation speed and to achieve even higher precision in the electronic component mounting apparatus, there are being developed X-Y robots which employ a linear motor, or component suction nozzles with an upward/downward drive mechanism which can be pressure controlled so as to adjust pressure when mounting components. For high-speed operation of such nozzles, there have been developed an upward/downward drive mechanism having a drive source, such as a rotary motor or air cylinder, and a ball screw or link mechanism combined with such drive source, or a voice coil motor (hereinafter referred to as VCM) having a shaft in the interior thereof, at the lower end of which a nozzle is attached uniformly or in operative connection so that the nozzle is directly driven upwards and downwards at a high speed.

One conventional electronic component mounting apparatus using this VCM will be described with reference to FIG. 5 showing its system construction and FIG. 6 which is a flow chart of control actions in the event of an abnormal condition.

In FIG. 5, 1 is a nozzle for picking up and mounting electronic components, 2 is a VCM having a shaft 8 for causing the nozzle 1 to move upwards and downwards, 3 is a position detector or a magnet scale for detecting the position of the VCM 2 in upward and downward directions, 4 is a VCM control unit for executing positioning control of the VCM 2 and torque control of same by varying the amount of electric current supplied to the VCM 2, 5 is an input/output control unit for controlling suction/evacuation of the nozzle 1 and actions of a gripping device, 6 is a gripping device for preventing the fall of the nozzle 1 by holding the shaft 8, and 7 is a system control unit for sending the positioning control instructions and torque control to the VCM control unit 4.

Control of the electronic component apparatus described above will be explained with reference to FIG. 5. VCM 2 is controlled by a servo loop including magnet scale 3 and VCM control unit 4. In a servo lock state, the gripping device 6 is opened in accordance with the instruction from input/output control unit 5. When performing picking up and mounting operations of electronic components, the VCM control unit 4 drives the VCM 2 towards a predetermined position in accordance with instructions from system control unit 7, whereby the positioning of the nozzle 1 is achieved at a high speed.

In case the magnet scale 3, which performs position detection of the VCM 2, is disconnected and thereby positioning control by the VCM control unit 4 is impeded, control is effected as follows under order to keep the VCM 2 in control. Referring to FIG. 6, when disconnection is detected at step #1, the VCM control unit 4 outputs a braking signal to the input/output control unit 5, upon which the input/output control unit 5 instructs the gripping device 6 to close at step #2, and at the same time (at step #3), the VCM control unit 4 cuts a drive power supply to the VCM 2. By the above control, the upper end of the shaft 8 which is driven upwards and downwards within the VCM 2 is grasped by the gripping device 6, and the nozzle 1 attached at the lower end of the shaft 8 is prevented from falling.

However, in the control method of electronic component mounting apparatus as described above, there exists a time lag between the points when the drive power supply to the VCM 2 is cut and when the gripping device 6 holds the shaft 8. Since the sliding resistance between the shaft 8 driven upwards and downwards and the gripping device 6 is set as small as possible in this type of electronic component mounting apparatus because of the characteristics of VCM 2, there is a problem that the nozzle 1 at the lower end of the shaft 8 free-falls during this time lag. This problem occurs whenever the positioning control of the VCM 2 is impeded by any failures such as power outage of the VCM control unit 4, other than the case where the magnet scale 3 is disconnected.

SUMMARY OF THE INVENTION

In view of the foregoing, an object of the present invention is to provide an electronic component mounting method by which installing of an electronic component at higher speed can be accomplished and a nozzle can be prevented from falling in the event of failures of the positioning control of a VCM.

To accomplish the above object, the present invention provides an electronic component mounting method implemented in an electronic component mounting apparatus comprising a nozzle for picking up and mounting an electronic component, a voice coil motor including a shaft for moving the nozzle upwards and downwards, a gripping device for preventing the nozzle from free-falling by holding the shaft of the voice coil motor, an input/output control unit for controlling suction/evacuation of the nozzle and the gripping device, a voice coil motor control unit for positioning control of the voice coil motor and torque control of same by varying the amount of electric current supplied to the voice coil motor, a system control unit for instructing the positioning control and torque control to the voice coil motor control unit, and a position detector for detecting the position of the voice coil motor in upward and downward directions, the electronic component mounting method including a step of constant current control wherein a constant amount of electric current is supplied for a constant period of time to the voice coil motor from the voice coil motor control unit, the constant amount of electric current being preliminarily set in the voice coil motor control unit, and under circumstances where the positioning control of the voice coil motor by the voice coil motor control unit is impeded, the positioning control is switched to said constant current control, and the shaft of the voice coil motor is held by the gripping device during the constant current control.

With the above mounting method, even if the positioning control of a voice coil motor (VCM) for picking up and mounting electronic components by the VCM control unit is impeded due to over-loading, disconnection of a position detector, or an unexpected power failure, the positioning control is switched to constant current control, wherein a constant amount of electric current, which is preliminarily set in the VCM control unit, is supplied to the VCM from the VCM control unit for a constant period of time, during which the shaft of the VCM connected to the nozzle is grasped a gripping device. It is thus ensured that the nozzle will not free-fall and the electronic component mounting apparatus itself or a substrate onto which mounting operation is made are duly protected.

It is preferable if an amount of electric current supplied under a normal servo lock state is constantly recorded, and electric current is supplied in accordance with the most updated value to the voice coil motor during the constant current control, whereby the nozzle can be prevented from falling by grasping it with a force in accordance with variation in weights of the VCM just before the occurrence of the failure, electronic component, and nozzle, or changes of driving mechanisms with age.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION

Figure 5:
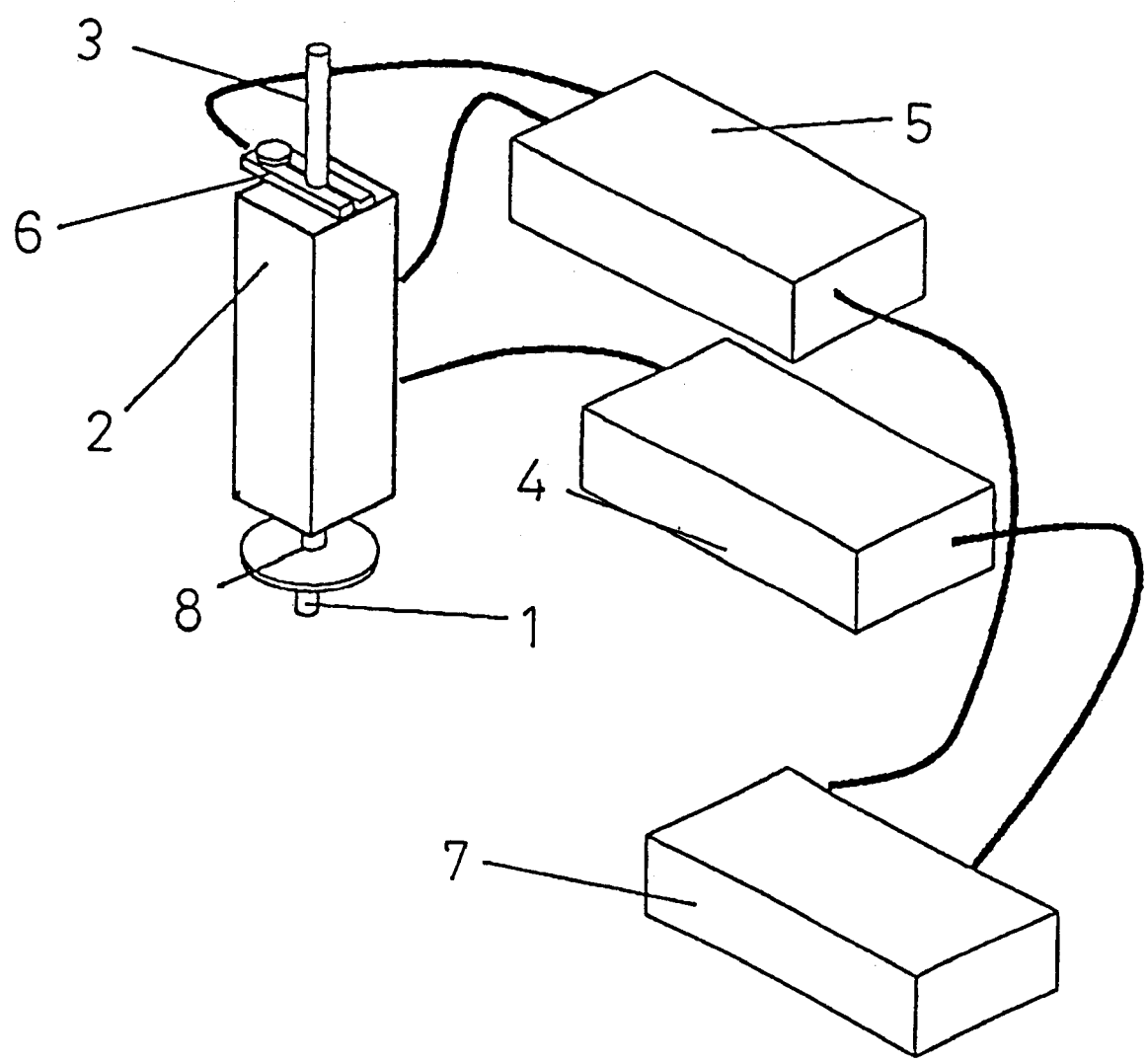
FIG. 5 is a perspective view schematically showing the construction of VCM control system in a prior art.
Figure 6:
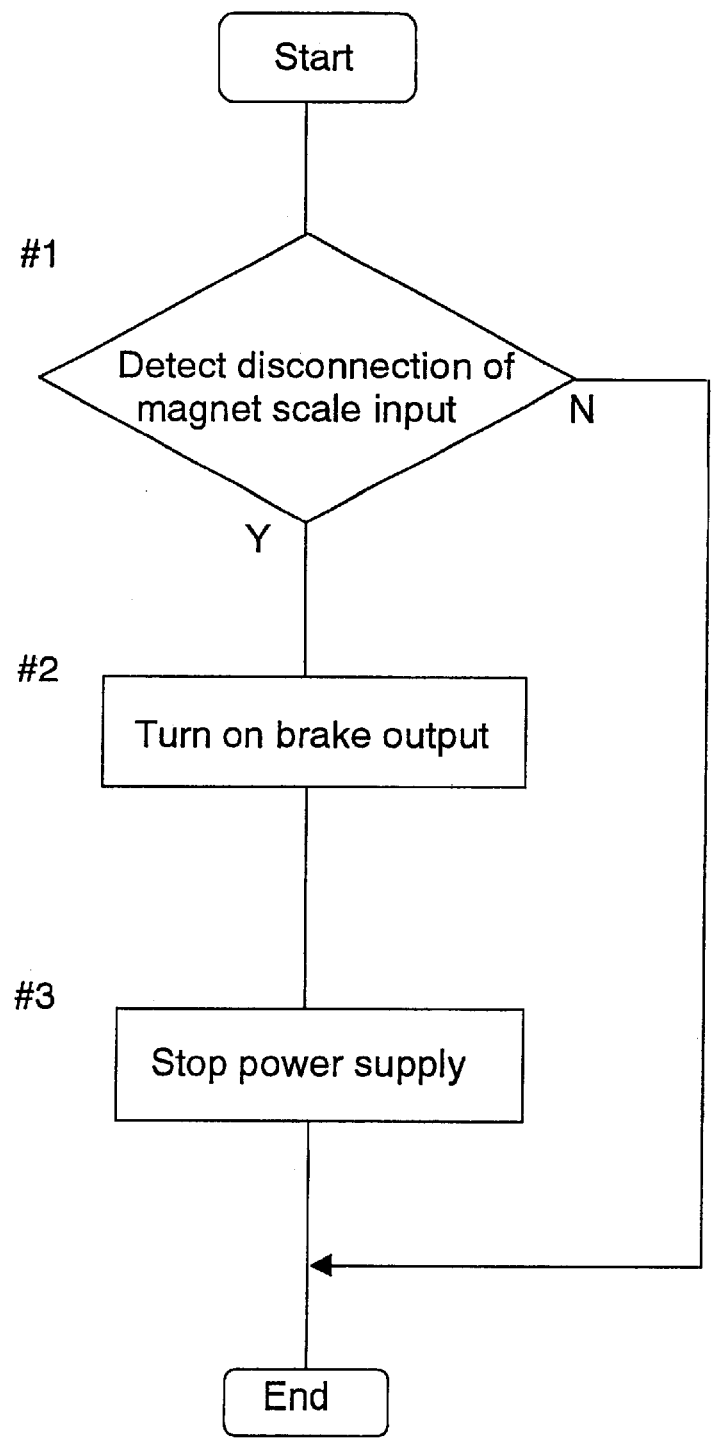
FIG. 6 is a flow chart showing control actions at the time of failures in a prior art.

An electronic component mounting method according to a first embodiment of the present invention will be hereinafter described with reference to FIG. 1 through FIG. 3. A VCM 2, as a shaft actuator and a gripping device are substantially the same as those shown in FIG. 5. FIG. 5 will thus be also referred to and the description will be made using the same reference numerals.

Figure 1:
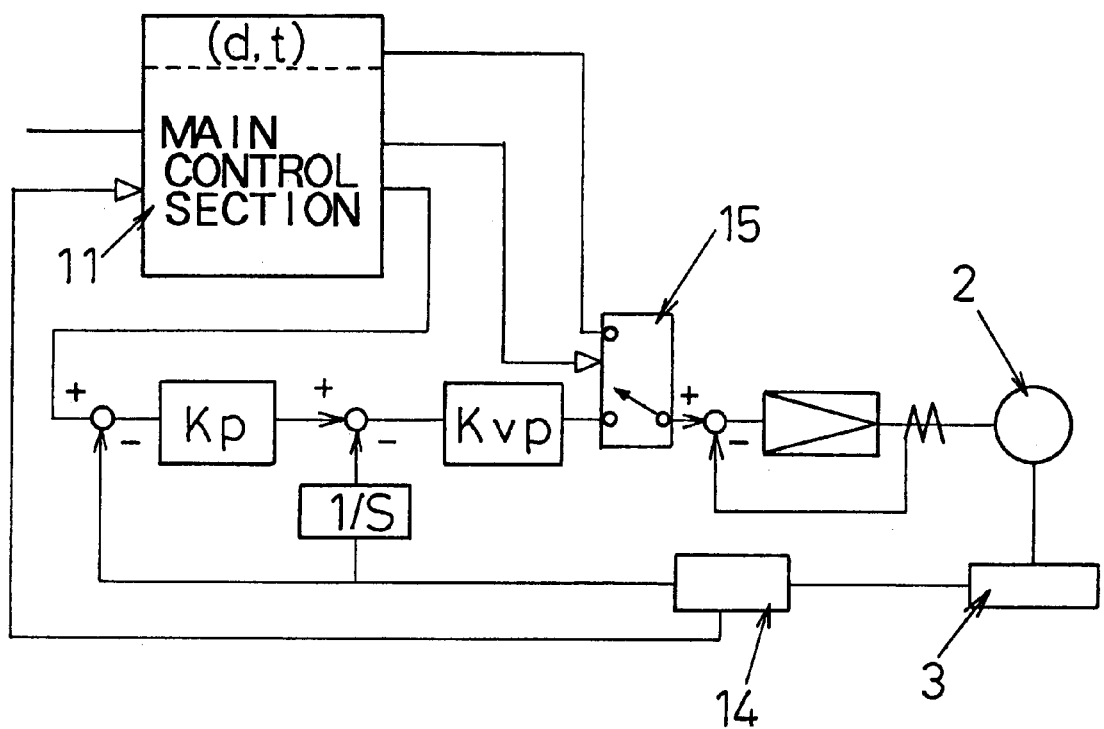
FIG. 1 is a block diagram showing the construction of a VCM control unit in a first embodiment of the present invention.

FIG. 1 is a block diagram of the VCM control unit. 11 is a main control section which outputs position instructions of the VCM based on instructions from the system control unit, 2 is a VCM for moving the nozzle 1 upwards and downwards, 3 is a magnet scale for detecting the position of the VCM 2 in upward and downward directions, 14 is a disconnection detecting circuit for detecting disconnection of the magnet scale 3, and 15 is a mode switch section for changing positioning control to constant current control and vice versa.

Figure 2:
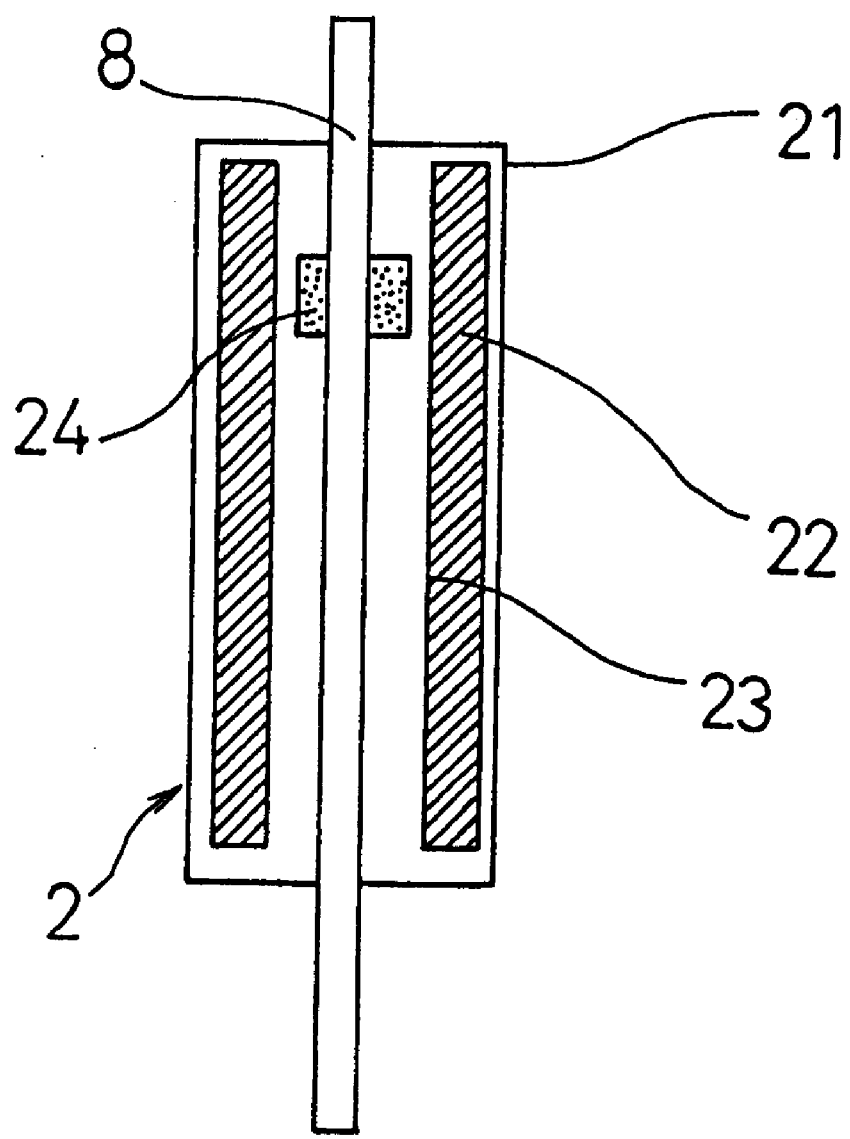
FIG. 2 is a side elevation view in longitudinal section showing a model construction of the first VCM in the embodiment.
Figure 3:
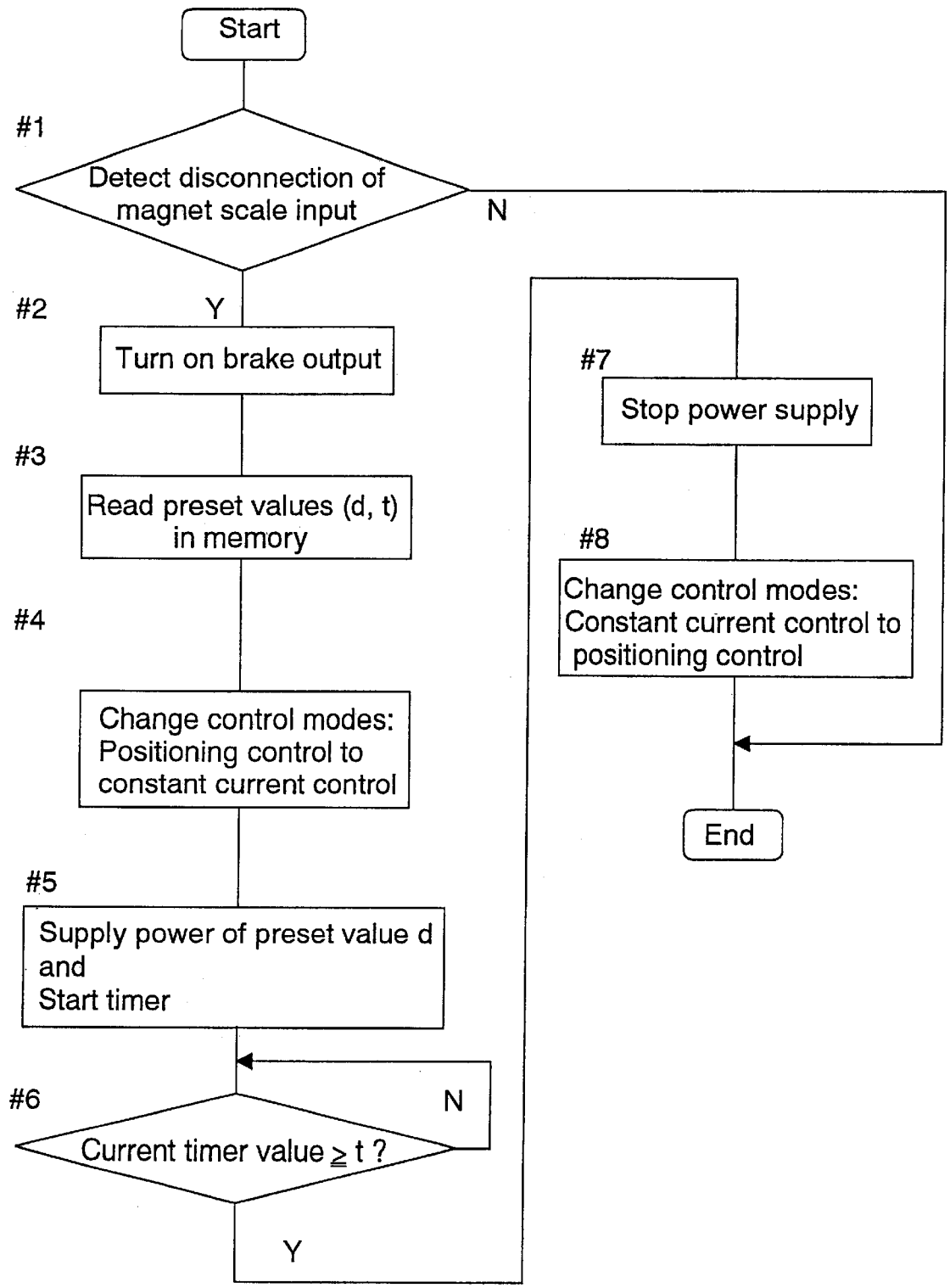
FIG. 3 is a flow chart showing control actions at the time of failures in the first embodiment.

Referring to FIG. 2 which shows a model construction of the VCM 2 and FIG. 5, 21 is the body of VCM 2, 22 is a coil, 23 is a bobbin around which the coil 22 is wound, and 24 is a magnet. 8 is a shaft which is driven directly and provided with a nozzle 1 at its lower end that is moved upward and downward uniformly or in operative connection with the shaft 8 thereby picking up and mounting electronic components. A magnet scale 3 is provided at the upper end of the shaft 8 in operative connection with the shaft for detecting the position in upward and downward directions of the VCM 2. The VCM 2 works as follows: a magnetic field is generated when a DC current is applied to the coil 22; and the magnet 24 attached to the shaft 8 generates force in accordance with the direction of the magnetic field to activate the shaft 8. The force which acts on the shaft 8 is proportional to the amount of electric current applied to the coil 22, and the direction thereof is defined by the polarity of the electric current.

Control of the electronic component mounting apparatus in the first embodiment described above will be explained taking the case as one example where the magnet scale 3 that detects the position of the VCM 2 is disconnected. FIG. 3 is a flow chart of actions performed when the magnet scale 3 is disconnected.

When disconnection detecting circuit 14 detects disconnection of the magnet scale 3 at step #1, the main control section 11 turns on a braking signal in order to prevent free fall of the nozzle 1 (step #2), and at the same time reads a preset electric current value d and a timer value t, for measuring the time for applying the electric current from a memory (at step #3). At step #4, the positioning control is changed to constant current control by means of the mode switch section 15. When the mode is switched to the constant current control, the electric current corresponding to the preset electric current value d applied to the VCM 2 and the timer is started at the same time (step #5).

When it is determined that the timer value t has passed at step #6, the power supply to VCM 2 is stopped at step #7, and the mode changes to the initial positioning control by the switching action of the mode switch section 15 at step #8.

The electric current value d is preliminarily set such that the gripping device 6 can hold the weight of the whole driving mechanism including the shaft 8 of the VCM 2, magnet 24, and nozzle 1 attached to the shaft 8, and the timer value t is set for the time until the braking action is completed. By such settings of the electric current value d and timer value t in the VCM control unit, the nozzle is prevented from free-falling during the constant current control.

By way of example, if the torque constant of VCM 2 is 5N/A and the weight of sliding parts is 350 g, since 1N=102 gf, 350 gf=3.43N, and 3.43 (N)/5(N/A)=0.69(A), thus d=690 (mA).

If the gripping device 6 is of the type wherein a cylinder having a solenoid valve uniformly attached thereto is air-driven, since its response time is 30 msec, it will suffice if the timer value t is set 100 msec.

Even in the event of power failure, control is possible for the period of about 200 to 500 msec due to charges accumulated in a smoothing capacitor for rectification.

As set forth above, according to the electronic component mounting method of the first embodiment of the present invention, under abnormal conditions where the positioning control of the VCM 2 is impeded such as disconnection or deviation failure of the position detector 13 or unexpected power outage, it is ensured that the upper end of the shaft 8 in the VCM 2 is grasped by the gripping device 6 thereby preventing the nozzle 1 at the lower end of the shaft 8 from falling.

Figure 4:
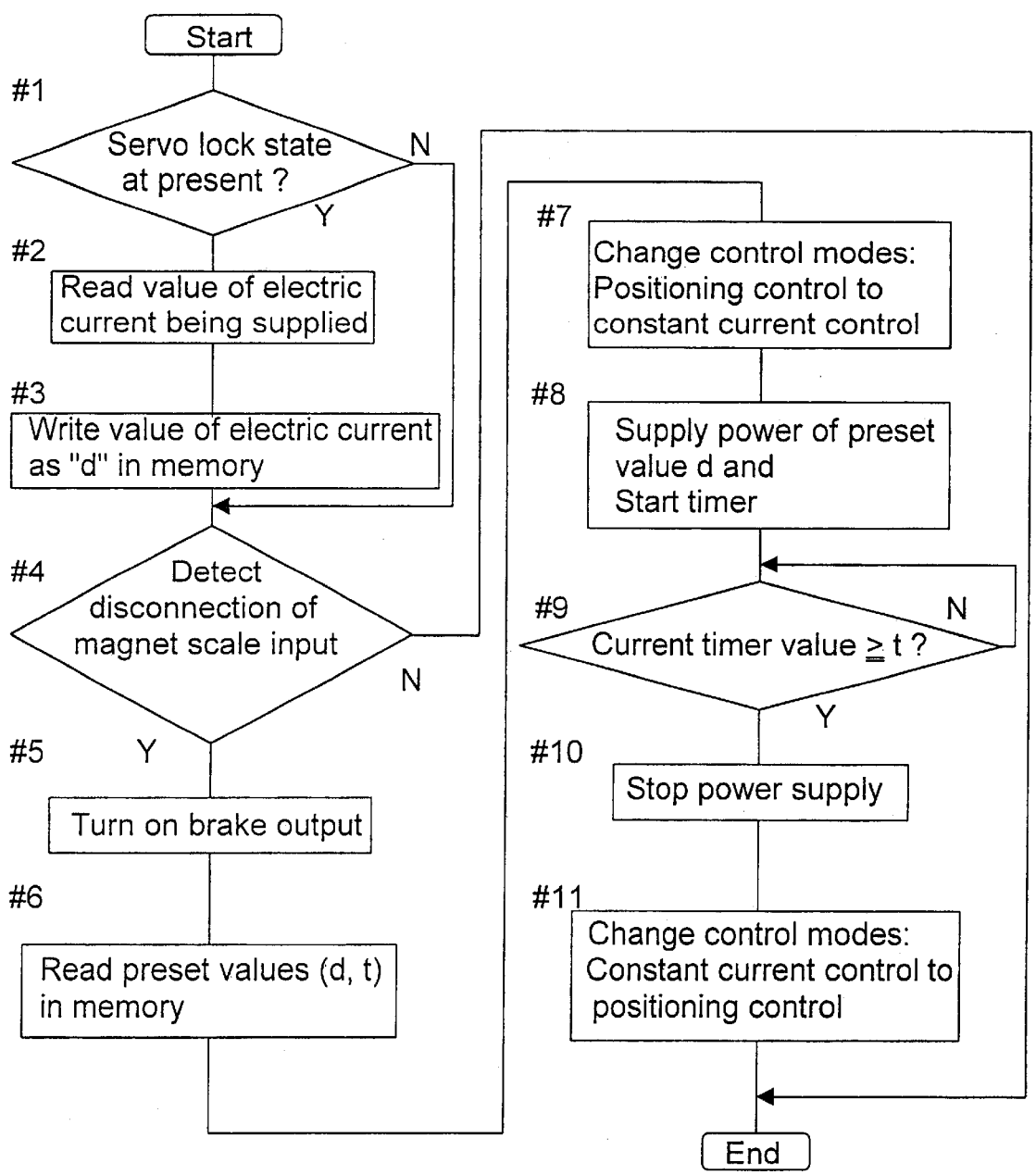
FIG. 4 is a flow chart showing control actions at the time of failures in a second embodiment of the present invention.

An electronic component mounting method implemented in an electronic component mounting apparatus according to a second embodiment of the present invention will be hereinafter described with reference to the flow chart of FIG. 4, taking as one example the case wherein the magnet scale 3 is disconnected as in the first embodiment.

The actions after the detection of disconnection (steps #4 to #11 in FIG. 4) are the same as those in the first embodiment. The difference is that from Step #1 to Step #3 (in FIG. 4), the electric current value under a servo lock state is constantly recorded in a memory as the preset value d of electric current supplied during the constant current control. Specifically, it is determined whether it is now a servo lock state or not at Step #1, and if not, the process moves to Step #4. If it is judged affirmatively at Step #1, the value of electric current supplied under the servo lock state is read at Step #2, and after writing the read value as a preset electric current value d in the memory at Step #3, the process moves to Step #4.

By updating the preset electric current value d constantly as described above, the nozzle is prevented from free-falling with an optimal force in accordance with variation of the weights of the electronic component to be mounted, the nozzle and changes of mechanical parts with age.

While the reading of the electric current value is described in the above second embodiment as one step of procedures for dealing with a failure such as disconnection, the reading and writing of the value of electric current supplied under a servo lock state in the memory may be done at any timing wherein the value of electric current under the servo lock state can be updated.

Although the present invention has been fully described in connection with the preferred embodiments thereof, it is to be noted that various changes and modifications apparent to those skilled in the art are to be understood as included within the scope of the present invention as defined by the appended claims unless they depart therefrom.

What is claimed is:

1. An electronic component mounting method implemented in an electronic component mounting apparatus the mounting apparatus providing:
   a nozzle for picking up and mounting an electronic component;
   a voice coil motor having a shaft for moving said nozzle upwards and downwards;
   a gripping device for gripping said nozzle to prevent said nozzle from free-falling by holding said shaft;
   a control unit for controlling said nozzle and said gripping device;
   a voice coil motor control unit for effecting position control mode for effecting positioning control and torque control of said voice coil motor by varying an amount of electric current supplied to said voice coil motor;
   a system control unit for instructing said voice coil motor control unit; and
   a position detector for detecting a position of said voice coil motor in upward and downward directions and sending a signal indicating said position to said voice coil motor control unit to effect servo control;
said electronic component mounting method comprising the steps of:
   providing said voice coil motor control unit with constant current control mode for supplying a constant amount of electric current for a constant period of time to said voice coil motor, said constant amount of electric current being set in said voice coil motor control unit so as to effect holding of said shaft; and
   switching from said position control mode to said constant current control mode when said positioning control of said voice coil motor is impeded; and
   engaging said gripping device, during said constant current control mode, so as to hold said shaft and avoid free-fall of said nozzle.

2. The electronic component mounting method according to claim 1, further comprising:
   repeatedly recording said amount of electric current supplied under a normal servo lock state; and
   setting said constant amount of electric current equal to a most recently updated value of said amount of electric current supplied under said normal servo lock state that is recorded for application during said constant current control mode.

3. The method of claim 1, wherein said constant amount of electric current is preliminarily set at a level sufficient for supporting said shaft prior to initiation of operation of said electronic component mounting apparatus.

4. A method of controlling a mounting unit having a shaft operated under servo control using a current driven shaft actuator, comprising the steps of:
   detecting interruption of said servo control; and
   switching from a positioning control mode to a constant current control mode for supplying an constant amount of current to said shaft actuator to suspend said shaft.

5. The method of claim 4 further comprising:
   engaging a gripping device, for holding said shaft, so as to keep said shaft from free-falling when interruption of said servo control is detected; and
   maintaining said constant current control mode at least until said gripping device grips said shaft.

6. The method of claim 5 wherein said current control mode includes the steps of:
   maintaining said supplying of said constant amount of current for a predetermined period of time; and
   disengaging power supplied to said actuator after said predetermined period of time has elapsed.

7. The method of claim 6 wherein said current control mode further includes a step of switching from said constant current control mode to said positioning control mode after said predetermined period of time has elapsed.

8. The method of claim 6, wherein said predetermined period of time is set for a period sufficient for said gripping device to hold said shaft.

9. The method of claim 4, wherein a magnet scale detects a position of said shaft and emits a position signal for effecting servo control.

10. The method of claim 9, wherein detecting interruption of said servo control is effected by detecting a loss of said position signal.

11. The method of claim 4, wherein:
   said shaft actuator is a motor assembly having a magnet attached to said shaft and a coil; and
   said constant amount of current is set such that said shaft actuator can hold a combined weight of an entire driving mechanism including said shaft, said magnet, and a nozzle attached to said shaft.

12. The method of claim 4, further comprising:
   repeatedly recording an electric current value supplied to said actuator under a servo lock state; and
   using a most recently recorded value of said electric current as said constant amount of current.

* * * * *